United States Patent
Von Elbwart et al.

(10) Patent No.: US 7,552,375 B2
(45) Date of Patent: Jun. 23, 2009

(54) METHOD, AN ENCODER AND COMMUNICATION DEVICE FOR INDIVIDUALLY ENCODING CODE BLOCK SEGMENTS

(75) Inventors: Alexander Golitschek Edler Von Elbwart, Darmstadt (DE); Christian Wengerter, Kleinheubach (DE); Elko Seidel, Darmstadt (DE)

(73) Assignee: Panasonic Corporation, Osaka (JP)

( * ) Notice: Subject to any disclaimer, the term of this patent is extended or adjusted under 35 U.S.C. 154(b) by 296 days.

(21) Appl. No.: 10/565,194

(22) PCT Filed: Apr. 26, 2004

(86) PCT No.: PCT/EP2004/004398

§ 371 (c)(1),
(2), (4) Date: Apr. 7, 2006

(87) PCT Pub. No.: WO2005/015749

PCT Pub. Date: Feb. 17, 2005

(65) Prior Publication Data

US 2007/0022355 A1    Jan. 25, 2007

(30) Foreign Application Priority Data

Jul. 24, 2003    (EP) .................................. 03016896

(51) Int. Cl.
  *H03M 13/00* (2006.01)
(52) U.S. Cl. .................................................... 714/752
(58) Field of Classification Search ................ 714/752, 714/757, 786, 792, 794
  See application file for complete search history.

(56) References Cited

U.S. PATENT DOCUMENTS

| | | | | |
|---|---|---|---|---|
| 4,965,576 A | * | 10/1990 | Watanabe et al. | 341/94 |
| 5,666,370 A | * | 9/1997 | Ganesan et al. | 714/752 |
| 5,687,181 A | * | 11/1997 | Suemura et al. | 714/757 |
| 6,105,159 A | * | 8/2000 | Frederickson | 714/762 |
| 6,170,073 B1 | * | 1/2001 | Jarvinen et al. | 714/758 |
| 6,532,564 B1 | * | 3/2003 | Ito et al. | 714/752 |
| 6,661,355 B2 | | 12/2003 | Cornelius et al. | |
| 6,693,973 B2 | * | 2/2004 | Ionescu | 375/295 |
| 6,769,091 B2 | * | 7/2004 | Classon et al. | 714/792 |

FOREIGN PATENT DOCUMENTS

WO        99/50963        7/1999

OTHER PUBLICATIONS

PCT International Search Report dated Aug. 17, 2004.
European Search Report dated Oct. 27, 2003.

(Continued)

*Primary Examiner*—Shelly A Chase
(74) *Attorney, Agent, or Firm*—Dickinson Wright, PLLC

(57) ABSTRACT

A method of encoding data in a code block comprising an information bit sequence in a communication device of a communication system comprising the step of separating the information bit sequence into a plurality of subsets of information bits. Each subset forming a code block segment. Further, the method comprises the step of encoding the code block segments individually using at least one encoding method. The invention also relates to a correspondingly adapted encoder and communication device to carry out the encoding method.

11 Claims, 3 Drawing Sheets

OTHER PUBLICATIONS

L.H. Charles Lee: "Error-control block codes for communications engineers," Jun. 28, 2000, Artech House, XP002259256, pp. 52-55.

C. Berrou, et al.: "Near Optimum Error Correcting Coding and Decoding: Turbo-Codes," IEEE Transactions on Communications, IEEE Inc., New York, US, vol. 44, No. 10, Oct. 1, 1996, pp. 1261-1271, XP000629465, ISSN: 0090-6778.

S. Lin, et al., "Error Control Coding: Fundamentals and Applications," Prentice-Hall Series in Computer Applications in Electrical Engineering, pp. 51-57, 141-177, and 287-295, 1983.

C. Heegard, et al., "Turbo Coding," Kluwer Academic Publishers, Chapter 4, ISBN 0-7923-8378-8, pp. 65-88, 1999.

Chinese Office Action dated Jun. 13, 2008 with an English translation therof.

* cited by examiner

METHOD, AN ENCODER AND COMMUNICATION DEVICE FOR INDIVIDUALLY ENCODING CODE BLOCK SEGMENTS

This invention relates to forward error correction coding schemes, and is particularly applicable in communication systems where reliable transmission of data is required to overcome errors introduced by noise or interference.

Forward error correction (FEC) schemes are widely used in communication systems to increase the reliability of information transmission. Some popular FEC codes are convolutional codes, turbo codes, Reed-Solomon codes, or low-density parity-check codes as known for instance from S. Lin, D. J. Costello Jr., "Error Control Coding: Fundamentals and Applications", Prentice-Hall 1983.

Forward error correction coding can be generally defined as a systematic scheme for the replacement of the original information symbol sequence by a sequence of code symbols, in such a way as to permit its reconstruction by a properly designed decoding scheme.

Usually a major division is between block coding and convolutional coding. In block coding, the information sequence is split into blocks of fixed length. Each of these blocks is then independently encoded using the block code, which usually is represented by a coding polynomial or coding matrix.

In contrast thereto, a convolutional code does not treat each code block independently, but adds dependence between successive blocks. Thus the current output block depends not only on information bits in the current input block, but also on those of one or more previous input blocks.

Typically convolutional codes are realised by using a shift register mechanism. Graphically a convolutional code can be represented by a state transition diagram or a trellis.

While in theory it is possible to extend the dependencies into infinity, in communication systems it is common practice to define a block length for convolutional codes as well. This makes it possible to have a code structure which starts at the beginning of each block in a well-known state, and which ends at the end of each block in a well-known state, which is usually referred to as trellis termination. This will make the decoding scheme in the receiver more efficient.

To achieve a better protection of the information to be transmitted, several coding schemes can be employed simultaneously. This means that the information sequence is encoded several times, and the information sequence at the input of the encoders is identical. An obvious graphical representation is reminding of the parallel connection of electrical resistors to an electrical current, therefore such an approach is often called parallel coding scheme.

In a simple form, a parallel coding scheme can consist of two identical encoders, for example convolutional encoders. Other forms can make use of two different encoders, such as a convolutional encoder and a block encoder.

A popular parallel coding scheme widely known as turbo coding is e.g. available from Heegard, Chris; Wicker, Stephen B., "Turbo coding" chapter 4, Kluwer Academic Publishers 1999, ISBN 0-7923-8378-8. Illustrated in exemplary form in FIG. 5 is the structure of a -prior art turbo encoder. Typically, two identical convolutional encoders with an additional interleaver are employed. The interleaver is used to de-correlate the input to the second, encoder from the input of the first encoder.

A data source is generating an information word which consists of k information bits forming a code block. The resulting code word consists of three elements: The systematic word, first parity word and second parity word. The systematic word (length k bits) is identical to the information to be transmitted. The first parity information is generated employing a recursive systematic encoder (RSC). In the second encoder branch, an interleaver is employed to decorrelate the input sequences of both encoders. Both encoders use a generator polynomial to define the coding algorithm.

U.S. 2003/0041293 A1 discloses methods to interleave a sequence of symbols. To this end the interleaver performs inter-block and intra-block permutations. Even though the sequence of symbols is segmented into blocks, these blocks are used solely for the purpose of interleaving, but not for generating blocks that are independently encoded.

U.S. 2002/0150167 A1 discloses a configurable encoder which may operate in any of a variety of forward error correction codes. In each mode a variety of encoding parameters may be configured.

In the prior art, measures have been proposed, such as adding redundancy or diversity to the transmit signal to increase the receiver's possibility to correctly decode the transmitted data.

The object of the present invention is to effectively exploit coding properties and to allow a simple but effective method to increase the protection of the transmitted information, especially in wireless communication systems with unreliable transmission due to noise or interference.

The present invention provides a method comprising the steps of claim 1 and is also directed to a correspondingly adapted encoder and communication device.

The general idea underlying the invention is to separate an information bit sequence forming a code block into a plurality of subsets of information bits, whereby each subset forms a code block segment. Subsequently, the code block segments are separated from each other and individually encoded using at least one encoding method. In this manner, the invention encodes the information bit sequence either in a time diversity manner or using a plurality of parallel coding subbranches.

In order to realize time diversity, it may be necessary to buffer at least a portion of either the complete code block or one or more of the code block segments prior to encoding same.

Preferably, the encoding of the code block segments or code blocks is performed using different encoding methods, which furthermore increases the effectiveness in protecting the data bits.

According to a preferred embodiment of the invention, the segmentation of the code blocks is performed into code block segments of equal length. This facilitates a simple encoding operation and increases the processing speed.

It further increases the performance of the encoding method, if the step of interleaving the information bits is performed in the coding branches or subbranches, preferably with is different interleaving patterns.

According to further preferred embodiments of the invention, the separation of the information bit sequence is performed either by periodically switching the input bit sequence to one of the subbranches or a transition/puncturing vector or matrix determines which bits are forwarded to which subbranches or removed.

The invention will become apparent from the following description of the preferred embodiments with reference to the accompanying drawings.

Figure 4:
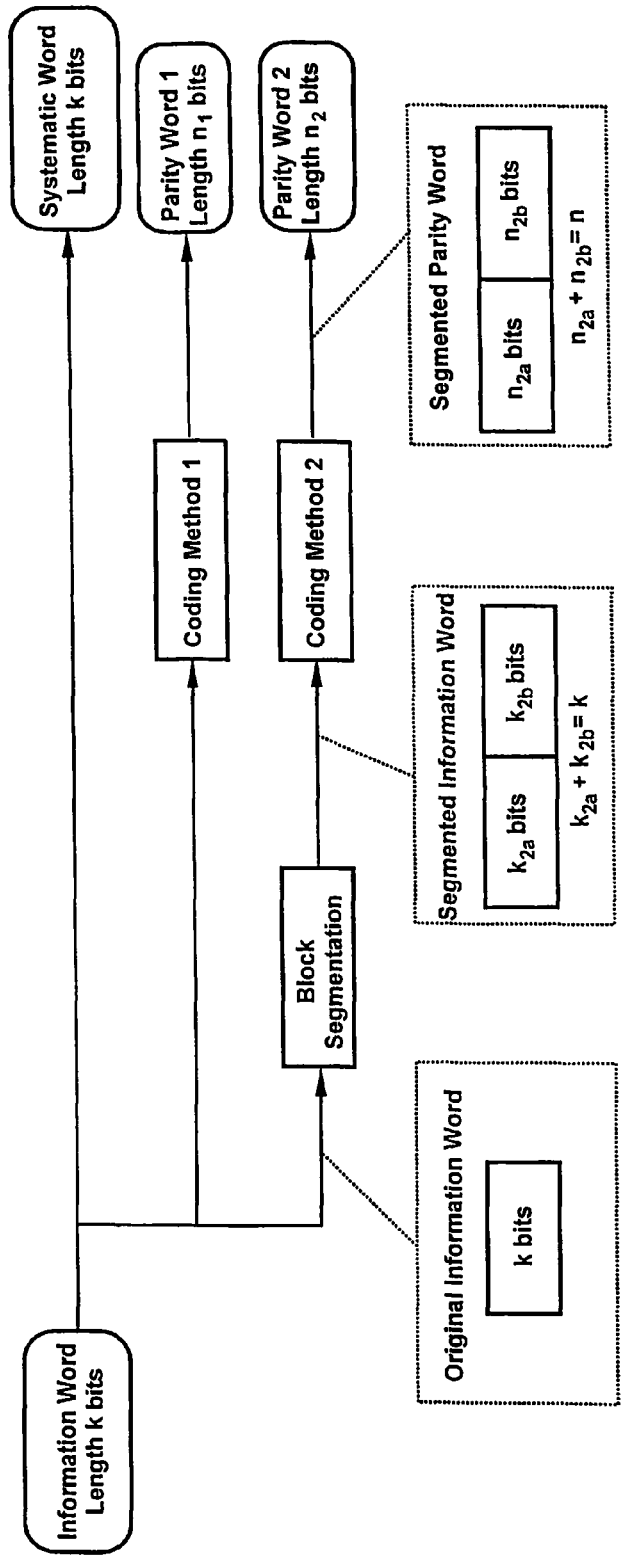
Figure 5:
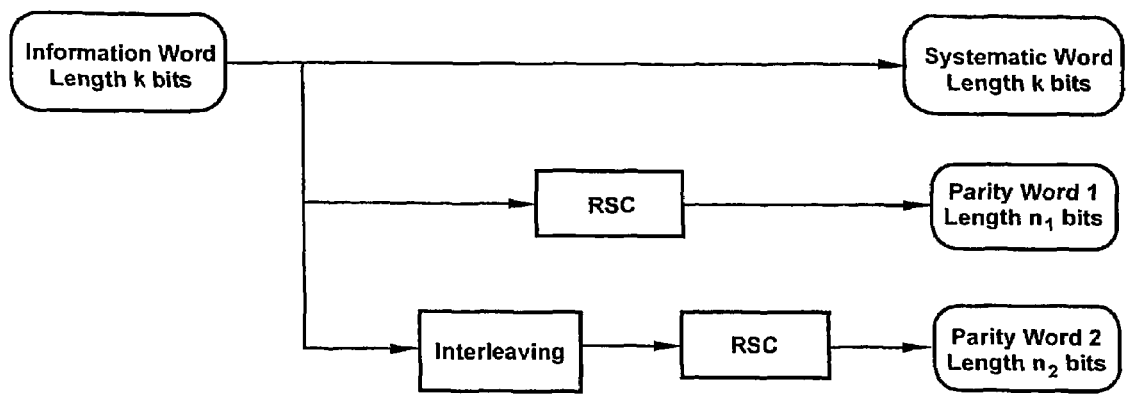

FIG. 4 gives an alternative embodiment of the present invention using identical coding methods within the sub-branches of one coding branch;

FIG. 5 shows a prior art turbo encoder in simplified form.

Figure 1:
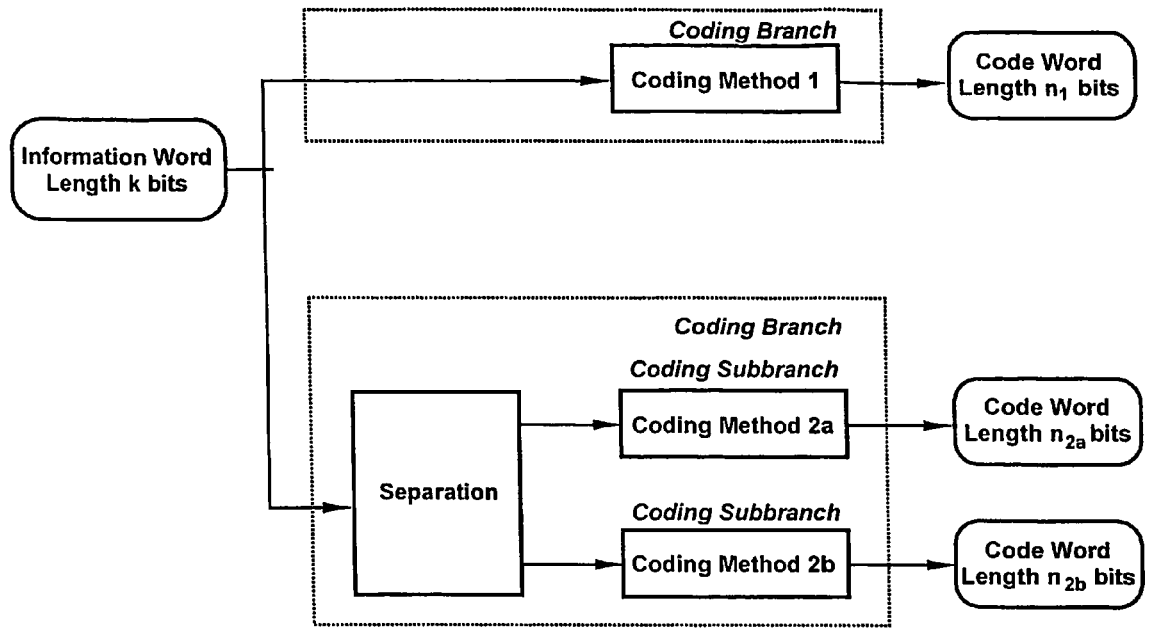
FIG. 1 shows a block diagram which illustrates the general idea of the present invention.

The following is a definition of important terms, used in the context of the invention referring to FIG. 1.

Information Word or Information Bit Sequence

Block codes are defined in line with S. Lin, D. J. Costello Jr., "Error Control Coding: Fundamentals and Applications", Prentice-Hall 1983, chapter 1.2. A message block is represented by the k-tuple $u=(u_1, u_2, \ldots, u_k)$ called an information word or information bit sequence. For convolutional codes, we use a different definition. An information word is the k-tuple $u=(u_1, u_2, \ldots, u_k)$, where the convolutional encoder memory is cleared before $u_1$ enters the encoder.

Coding Branch

Coding branch is defined by a branch where the full information word is available to subsequent entities.

Coding Subbranch

A coding subbranch is a portion of a coding branch, wherein only a subset of the information bits are available to the blocks within the coding subbranch.

Code Block

A code block is a logical unit of information symbols which are affected by a coding process.

Subset

A subset denotes a part of a set, where the empty set and the original set are by definition also subsets of the original set.

FIG. 1 shows a block diagram of an encoder as comprised in a communication device of the present invention. At the input of the encoder, an information word having k bits is applied as a code block to two coding branches. In the first coding branch, a method 1 is used to obtain a code word 1 having a length of $n_1$ bits with $n_1$ being larger than k.

Generally, the coding operation serves for adding redundancy In order to protect the information bits better against losses over the transmission path.

In the second branch, the k bits of the information word are separated into two distinct subbranches, so that a first subset of the information bits (also referred to as a code block segment) is encoded in the first subbranch using method 2a and a second subset of the information bits is encoded in the second subbranch using method 2b. These bit subsets shall be complementary, in other words altogether the subsets contain the same bits as the original information word, but they do not contain any identical bits of the information word. For simplicity, it is assumed here that the code block segments in the subbranches are of equal length, which implies that k is an even number. The results of the encoding operation are two code words 2a, 2b having a length of $n_{2a}$ and $n_{2b}$ bits, respectively.

It is important to note that the information bit subsets are encoded separately and independently in each subbranch. In a simple implementation, the encoding method in the subbranches is identical, such that their generator polynomials are identical as well. The encoded bit sequences of each subbranch then constitute jointly a parity word which replaces the second parity word of the prior art encoder shown in FIG. 5.

It should be obvious to those skilled in the art that the generated parity sequences can be further manipulated or assembled to obtain a complete code word for the information word. While those are necessary or desired operations, they are not required for explaining the present invention and are consequently not described in further detail.

The coding method does not need to be identical in all the coding branches or subbranches. The difference can be fundamental, such as convolutional code in one branch and block code in another. On the other hand there could also be differences within the same coding family, such as different generator polynomials in convolutional encoders in the branches, or for example a different coding matrix which is used in different branches. The type or nature of the employed encoders in the branches is not restricted by the present invention. As an example the encoders in FIG. 1 labelled "Coding Method 1", "coding Method 2a" and "Coding Method 2b" can be chosen freely and independently within the limits imposed by the communication system design for which the present invention is used.

Figure 2:
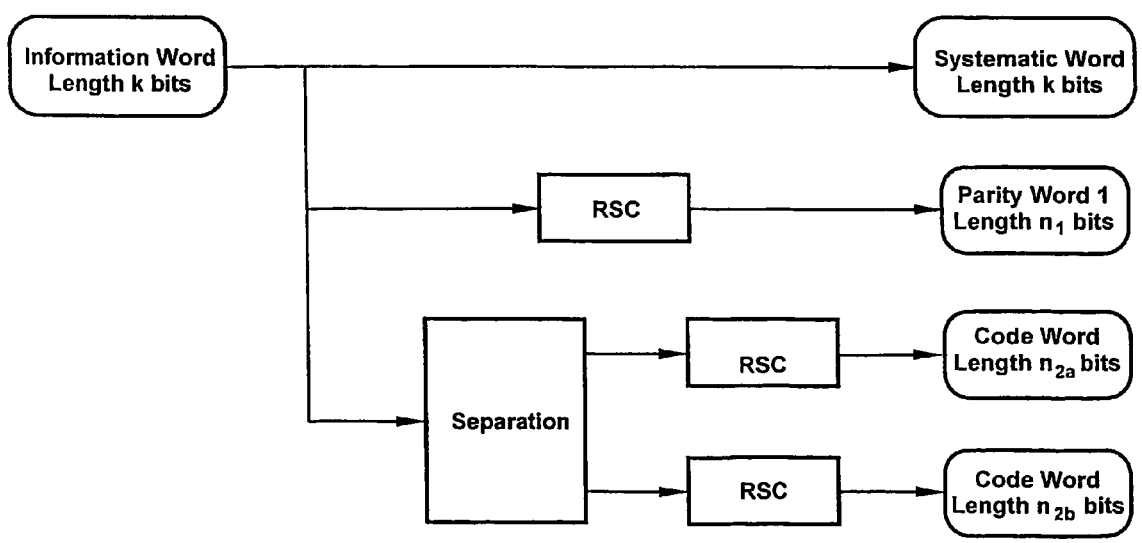
FIG. 2 is an embodiment of the invention illustrating its application to a turbo encoder.

FIG. 2 shows an embodiment of the invention illustrating its application to a turbo encoder. As can be seen when comparing this figure with FIG. 1, the essential difference can be seen in the fact that the information word is directly provided as systematic word to be output. Further, parity word 1 is obtained by employing a recursive systematic encoder RSC, thereby constituting the coding branch having a parity word 1 at its output. The second coding branch is further divided into two coding subbranches to obtain a parity word 2a and parity 2b, as explained above in connection with FIG. 1. When compared with FIG. 5, the prior art turbo encoder is modified in respect to the second encoder branch with the result that the two parity words 2a and 2b jointly constitute parity word 2.

Figure 3:
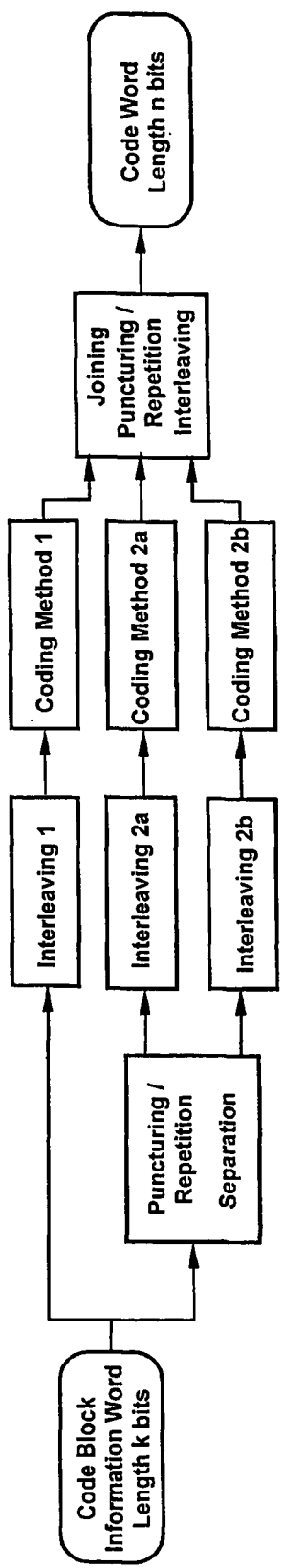
FIG. 3 shows an encoder according to the present invention with additional elements involved in the coding operation.

For improved performance, one or more optional interleavers may be introduced within a coding branch or subbranch, see FIG. 3. This can be necessary to further improve the properties and performance of the employed coding schemes.

Another embodiment not explicitly shown in FIG. 3, but is apparent to those skilled in the art, would be obtained by modifying the position of interleavers 2a, 2b by placing an interleaver 2 just prior to the separation unit.

For both embodiments, it has been proven that using a different interleaving pattern for either the different coding subbranches or between the coding branch at the coding subbranches improves the performance of the coding operation.

The separation of the code block into two or more code block segments can be implemented in several forms. Simple forms include a switch which periodically switches the input to one of the subbranches, a transition vector or matrix which signifies unambiguously which input bit shall be forwarded to which output or a puncturing vector or matrix for each subbranch that determines which bits can pass through and which bits are removed for that particular subbranch.

In case the encoding methods within subbranches of a branch are identical, an alternative layout Is possible. An example is given in FIG. 4. Instead of separating the information bit sequence into distinct parallel subbranches, it is split into two or more segments, which are then individually encoded in a time diversity manner using the encoder method chosen for that branch.

In more detail, the information bits of the code block are used to form a systematic word and parity word 1 using a coding method 1 as explained above. Further, the original information word constituted by k bits is buffered and undergoes block segmentation using one of the methods described above. Hence, the code block is separated into two code block segments, each containing a segmented information word of $k_{2a}$, bits and $k_{2b}$ bits, respectively. Subsequently, by using coding method 2, the first segment is encoded resulting in a first portion of the segmented parity word with $n_{2a}$ bits. This portion of the segmented parity word may be stored again in a buffer for later use. As the next step, a second segmented information word having $k_{2b}$ bits is encoded using the same coding method 2 to obtain the second portion of the parity word comprised by $n_{2b}$ bits. The two parity word segments may then be combined to form the complete parity word 2 having a length of $n_2$ bits.

It is clear to a person skilled in the art that other than the above described segmentation in two halves of substantially equal length can be chosen depending on the actual encoder design. In particular, a partitioning in more than two segments might be a favorable option.

Preferably the segmentation is done such that the segments are of identical length. If this is not possible, then well-known techniques may be employed so that the resulting segments are of equal length. Possible solutions for this are zero-stuffing or partial repetition of the information bit sequence. Alternatively the segments may have different lengths provided that the length is not a criterion for the encoding scheme. For example in convolutional coding the block length is irrelevant for the design of most encoders.

In case of convolutional coding for an encoder, some sort of trellis termination can be desirable. This means that certain bits are appended either to the encoder input or the encoder output, which makes the state of the encoder at the end of a codeblock to be independent of the information bit sequence which is encoded. Preferably this termination state is the all-zero state. Further details about termination can be found in S. Lin, D. J. Costello Jr., "Error Control Coding: Fundamentals and Applications", Prentice-Hall 1983.

If so-called termination bits are appended, there are two options. Either termination bits are appended to the information bit sequence within the respective coding branch or subbranch only or termination bits are appended to the information bit sequence in several or all coding branches or subbranches. It should be obvious for those skilled in the art how either option can be implemented.

To facilitate efficient decoding methods, It can be desirable to include an error detection code, such as a cyclic redundancy checksum (CRC). Such a code can be freely inserted prior to either the separator or the encoder in a branch or subbranch. In rare cases it might also be useful to attach an error detection code to the code word or parts of it, i.e. to systematic or parity words or subsets of these.

The embodiments explained above showed a case where there are two coding branches, and the second branch is further divided into two subbranches. However the present invention can be easily extended to a by theory unlimited number of branches as well as reduced to one branch which is further divided into subbranches. It is also open how many and which of the branches should be further divided into subbranches.

Likewise the number of subbranches can be more than two, and can also be different in case several branches are divided into subbranches.

Puncturing or Repetition can be employed in several phases of the method of the present invention to improve the performance or make fine adjustments to the amount of coding protection which is desired in the system.

With reference to FIG. 3, it can be seen that firstly, the length of the information word which is at the input of a coding branch can be adjusted by puncturing or repetition of bits. Preferably this is done prior to separation of the information word into coding subbranches. Alternatively such adjustments can also be implemented after separation but prior to encoding. It should be apparent to those skilled in the art that both forms are equivalent in effect and can be transformed into each other.

Secondly, an adjustment is possible for the resultant code word. Preferably this is done after the systematic and parity parts have been joined together. Alternatively the adjustments can be done within each coding branch or subbranch after the encoding but prior to joining. Again those skilled in the art will recognise that these forms can be transformed into each other.

In the foregoing description and the drawings, the terms "Systematic" and "Parity" have been used along how they are usually referred to in public literature related to turbo coding. This has been done to keep the description of the invention simple and easy to follow.

However the present invention can also be used in parallel coding schemes which do not make such a distinction between systematic and parity bits or words, but generally simply refer to code bits or words as illustrated and described above with reference to FIG. 1.

The invention claimed is:

1. A method of encoding data in a code block comprising an information bit sequence in a communication device of a communication system, the method comprising the steps of:
   separating the information bit sequence of a first coding branch into a first plurality of subsets of information bits, each subset forming a code block segment;
   encoding the code block segments individually using at least one encoding method;
   encoding the information bit sequence in a second coding branch individually and separate from the encoding operations of the first plurality of code block segments; and
   buffering at least a portion of either the code block or the code block segments prior to the encoding step.

2. A method of encoding data in a code block comprising an information bit sequence in a communication device of a communication system, the method comprising the steps of:
   separating the information bit sequence of a first coding branch into a first plurality of subsets of information bits, each subset forming a code block segment;
   encoding the code block segments individually using at least one encoding method; and
   encoding the information bit sequence in a second coding branch individually and separate from the encoding operations of the first plurality of code block segments, wherein:
   the encoding steps use at least one of convolutional codes, trellis codes, turbo codes, Reed-Solomon codes, and parity check codes.

3. A method of encoding data in a code block comprising an information bit sequence in a communication device of a communication system, the method comprising the steps of:
   separating the information bit sequence of a first coding branch into a first plurality of subsets of information bits, each subset forming a code block segment;
   encoding the code block segments individually using at least one encoding method;
   encoding the information bit sequence in a second coding branch individually and separate from the encoding operations of the first plurality of code block segments; and
   interleaving the information bits of one or more coding branches and/or subbranches, wherein:
   the step of interleaving the information bits is performed after separation and prior to the encoding step into code block segments.

4. A method of encoding data in a code block comprising an information bit sequence in a communication device of a communication system, the method comprising the steps of:
- separating the information bit sequence of a first coding branch into a first plurality of subsets of information bits, each subset forming a code block segment; and
- encoding the code block segments individually using at least one encoding method, wherein
- the length of the code blocks and/or code block segments is varied by zero-stuffing or partial repetition of the information bit sequence.

5. A method of encoding data in a code block comprising an information bit sequence in a communication device of a communication system, the method comprising the steps of:
- separating the information bit sequence of a first coding branch into a first plurality of subsets of information bits, each subset forming a code block segment;
- encoding the code block segments individually using at least one encoding method; and
- interleaving the information bits of one or more coding branches and/or subbranches, wherein
- the interleaving step uses different interleaving patterns for different coding branches or subbranches.

6. A method of encoding data in a code block comprising an information bit sequence in a communication device of a communication system, the method comprising the steps of:
- separating the information bit sequence of a first coding branch into a first plurality of subsets of information bits, each subset forming a code block segment;
- encoding the code block segments individually using at least one encoding method; and
- adjusting the length of the code block prior to its separation into code block segments.

7. A method of encoding data in a code block comprising an information bit sequence in a communication device of a communication system, the method comprising the steps of:
- separating the information bit sequence of a first coding branch into a first plurality of subsets of information bits, each subset forming a code block segment;
- encoding the code block segments individually using at least one encoding method; and
- adjusting the length of the code block prior to its separation into code block segments, wherein
- the adjustment is obtained by appending termination bits to the information bit sequence in at least one coding branch or subcoding branch.

8. A method of encoding data in a code block comprising an information bit sequence in a communication device of a communication system, the method comprising the steps of:
- separating the information bit sequence of a first coding branch into a first plurality of subsets of information bits, each subset forming a code block segment; and
- encoding the code block segments individually using at least one encoding method, wherein
- the separation is performed by periodically switching the input bit sequence to one of the subbranches.

9. A method of encoding data in a code block comprising an information bit sequence in a communication device of a communication system, the method comprising the steps of:
- separating the information bit sequence of a first coding branch into a first plurality of subsets of information bits, each subset forming a code block segment; and
- encoding the code block segments individually using at least one encoding method, wherein
- the separation is performed using a transition vector or matrix which signifies which input bit shall be forwarded to which subbranches.

10. A method of encoding data in a code block comprising an information bit sequence in a communication device of a communication system, the method comprising the steps of:
- separating the information bit sequence of a first coding branch into a first plurality of subsets of information bits, each subset forming a code block segment; and
- encoding the code block segments individually using at least one encoding method, wherein
- the separation is performed using a puncturing vector or matrix that determines which bits can pass through and which bits are removed for a particular subbranch.

11. A wireless communication device encoder that encodes data in a code block comprising an information bit sequence, the encoder comprising:
- a separator that separates the information bit sequence of a first coding branch into a first plurality of subsets of information bits, each subset forming a code block segment;
- a first encoder that encodes the code block segments individually using at least one encoding method;
- a second encoder that encodes the information bit sequence in a second coding branch individually and separate from the encoding operations of the first plurality of code block segments; and
- a wireless transmitter that wirelessly transmits the encoded code block segments and the encoded information bit sequence.

* * * * *